US012787531B2

(12) United States Patent
Tsai et al.

(10) Patent No.: US 12,787,531 B2
(45) Date of Patent: Nov. 3, 2026

(54) TRANSPARENT DISPLAY APPARATUS

(71) Applicant: AUO Corporation, Hsinchu (TW)

(72) Inventors: YuTang Tsai, Hsinchu (TW); Wang-Shuo Kao, Hsinchu (TW); Jia Hao Hsu, Hsinchu (TW); Kun-Cheng Tien, Hsinchu (TW)

(73) Assignee: AUO Corporation, Hsinchu (TW)

( * ) Notice: Subject to any disclaimer, the term of this patent is extended or adjusted under 35 U.S.C. 154(b) by 370 days.

(21) Appl. No.: 18/533,185

(22) Filed: Dec. 8, 2023

(65) Prior Publication Data

US 2025/0063879 A1 Feb. 20, 2025

(30) Foreign Application Priority Data

Aug. 14, 2023 (TW) ................................ 112130515

(51) Int. Cl.

| | |
|---|---|
| ***H10H 29/14*** | (2025.01) |
| ***H10H 20/84*** | (2025.01) |
| ***H10H 20/857*** | (2025.01) |
| ***H10W 90/00*** | (2026.01) |

(52) U.S. Cl.

CPC .......... *H10H 29/142* (2025.01); *H10H 20/84* (2025.01); *H10H 20/857* (2025.01); *H10W 90/00* (2026.01)

(58) Field of Classification Search

CPC . G02B 1/08; G02B 1/10; G02B 1/118; G02B 5/00; G02F 1/00; G09F 9/30; H10H 20/857; H10H 20/84; H10H 20/85; H10H 29/14; H10H 29/142; H10H 29/855; H10H 29/8552; H10F 39/00; H10F 39/18; H10F 39/186; H10F 39/1865; H10F 39/8057; H10K 50/80; H10K 59/80; H10W 90/00

See application file for complete search history.

(56) References Cited

U.S. PATENT DOCUMENTS

| | | | | |
|---|---|---|---|---|
| 8,841,836 B2 | 9/2014 | Kim et al. | | |
| 2015/0153488 A1* | 6/2015 | Zhang | ................ | H10K 59/8792 359/891 |
| 2016/0327853 A1 | 11/2016 | Sarma et al. | | |
| 2017/0168223 A1* | 6/2017 | Feng | .................... | G02B 6/0031 |

FOREIGN PATENT DOCUMENTS

| | | |
|---|---|---|
| CN | 103378124 | 10/2013 |
| CN | 106125486 | 11/2016 |
| CN | 109841644 | 6/2019 |
| CN | 211878375 | 11/2020 |
| CN | 114361369 | 4/2022 |

* cited by examiner

*Primary Examiner* — Brook Kebede
(74) *Attorney, Agent, or Firm* — JCIPRNET

(57) ABSTRACT

A transparent display apparatus includes a transparent substrate, a first pixel array and a light leakage suppression element. The transparent substrate has display areas and transparent areas. The first pixel array is disposed on the transparent substrate and includes first pixels and first openings. Each of the first pixel overlaps with a corresponding display area. Each of the first opening overlaps with a corresponding transparent area. The light leakage suppression element includes light blocking structures spaced apart from each other. The first pixels are disposed on a first side of the transparent substrate. At least a portion of each of the light blocking structures of the light leakage suppression element is disposed on a second side of the transparent substrate.

13 Claims, 6 Drawing Sheets

TRANSPARENT DISPLAY APPARATUS

CROSS-REFERENCE TO RELATED APPLICATION

This application claims the priority benefit of Taiwan application serial no. 112130515, filed on Aug. 14, 2023. The entirety of the above-mentioned patent application is hereby incorporated by reference herein and made a part of this specification.

BACKGROUND

Technical Field

The disclosure relates to a display apparatus, and in particular relates to a transparent display apparatus.

Description of Related Art

A transparent display apparatus refers to a type of display apparatus that provides a transparent display state for users to view the scene behind it, commonly seen in display windows, vending machines, and the like. The transparent display apparatus has display areas and transparent areas. The display area provides a display frame for the user to view, while the transparent area is transparent, allowing the user to see the scene behind. Pixels are provided in the display area to emit image beams toward the display surface of the transparent display apparatus to provide images. However, some of the image beams are reflected back into the transparent display apparatus at the interface between the display surface and the outside world, thereby passing through the back of the transparent display apparatus, causing a backside light leakage problem.

SUMMARY

A transparent display apparatus that may improve the backside light leakage problem is provided in the disclosure.

The transparent display apparatus of the disclosure includes a transparent substrate, a first pixel array, multiple signal lines, and a light leakage suppression element. The transparent substrate has multiple display areas and multiple transparent areas. The first pixel array is disposed on the transparent substrate. The first pixel array includes multiple first pixels and multiple first openings. The first pixels are arranged in an array along a first direction and a second direction, in which the first direction and the second direction intersect, and each of the first pixels overlaps a corresponding display area. Each of the first openings is surrounded by a portion of the first pixels, and each of the first openings overlaps with a corresponding transparent area. The signal lines are disposed on the transparent substrate and are electrically connected to the first pixels. The light leakage suppressing element includes multiple light blocking structures spaced apart from each other. The transparent substrate has a first side and a second side opposite to each other. The first pixels are disposed on the first side of the transparent substrate. At least a portion of each of the light blocking structures of the light leakage suppressing element is disposed on the second side of the transparent substrate.

DETAILED DESCRIPTION OF DISCLOSED EMBODIMENTS

Figure 1:
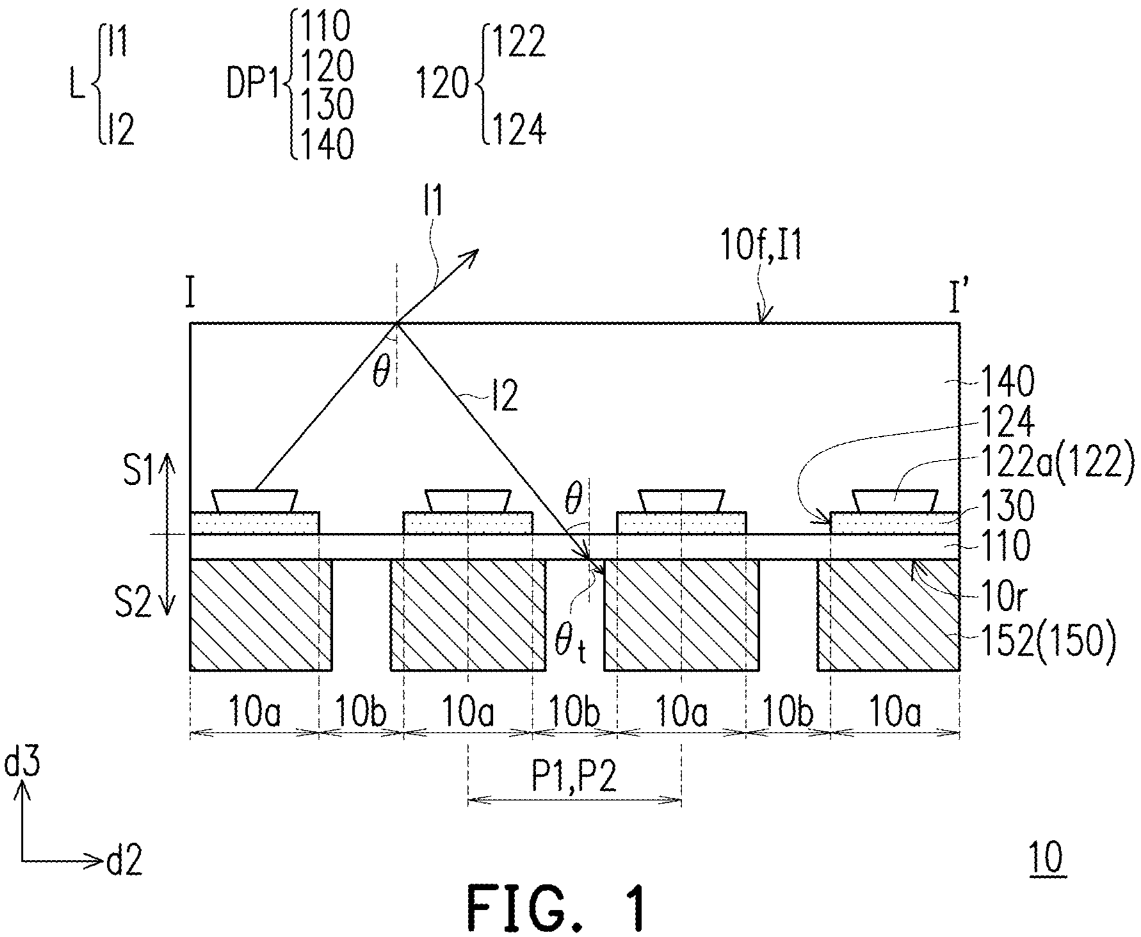
FIG. 1 is a cross-sectional schematic diagram of a transparent display apparatus according to an embodiment of the disclosure.

References of the exemplary embodiments of the disclosure are to be made in detail. Examples of the exemplary embodiments are illustrated in the drawings. If applicable, the same reference numerals in the drawings and the descriptions indicate the same or similar parts.

It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used herein, "to connect" may indicate to physically and/or electrically connect. Furthermore, "to electrically connect" or "to couple" may also be used when other elements exist between two elements.

The usages of "approximately", "similar to", or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may indicate to be within one or more standard deviations of the indicated value, or being within +30%, +20%, +10%, +5%. Furthermore, the usages of "approximately", "similar to", or "substantially" indicated throughout the specification may refer to a more acceptable deviation scope or standard deviation depending on optical properties, etching properties, or other properties, and all properties may not be applied with one standard deviation.

Unless otherwise defined, all terms (including technical and scientific terms) used herein have the same meaning as that commonly understood by one of ordinary skill in the art to which this disclosure belongs. It should be further understood that terms such as those defined in commonly used dictionaries should be construed as having meanings consistent with their meanings in the context of the related art and the disclosure, and are not to be construed as idealized or excessive formal meaning, unless expressly defined as such herein.

Figure 2:
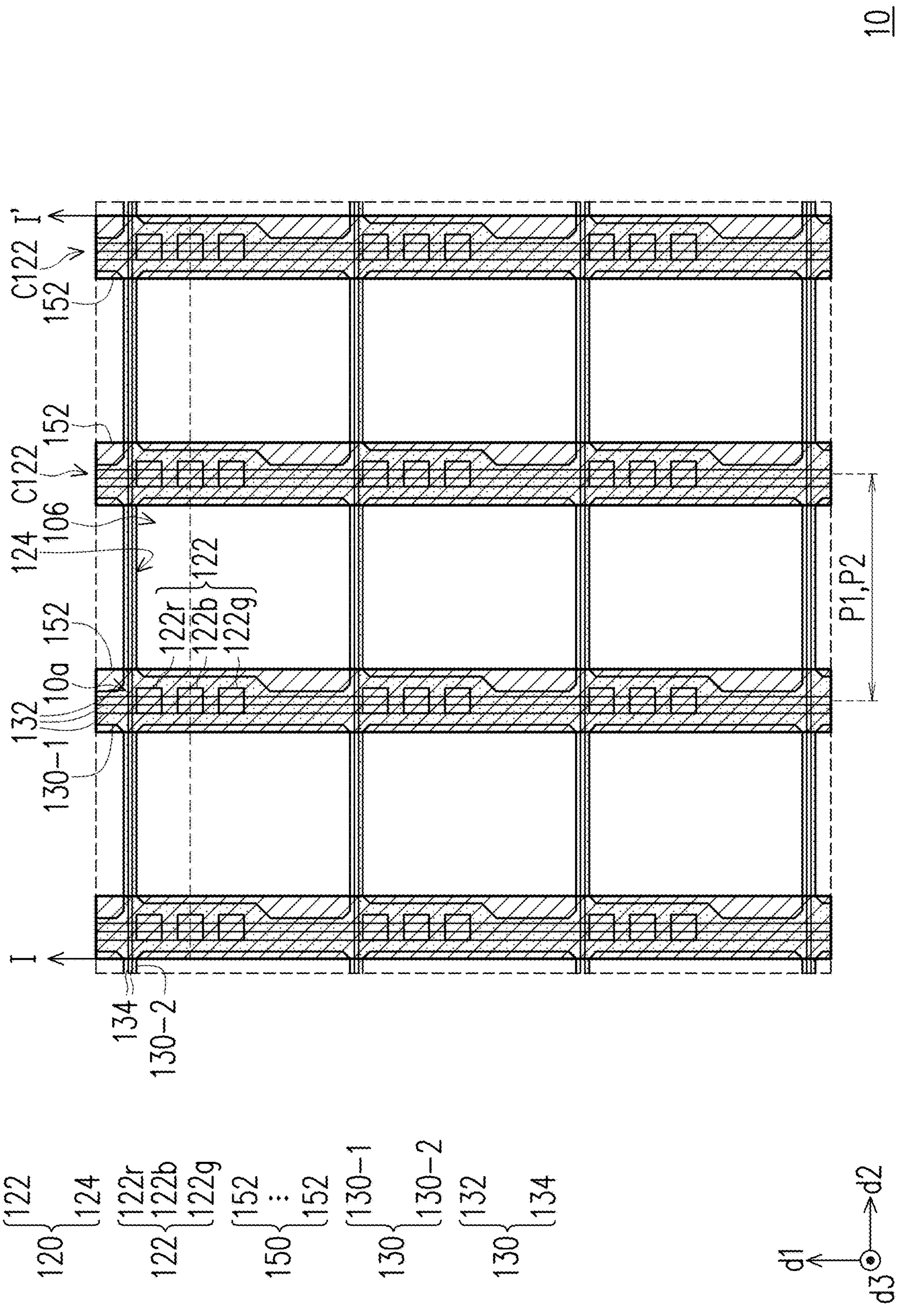
FIG. 2 is a top view schematic diagram of a transparent display apparatus according to an embodiment of the disclosure.

FIG. 1 is a cross-sectional schematic diagram of a transparent display apparatus according to an embodiment of the disclosure. FIG. 2 is a top view schematic diagram of a transparent display apparatus according to an embodiment of the disclosure. FIG. 1 corresponds to a section line I-I' in FIG. 2.

Referring to FIG. 1 and FIG. 2, the transparent display apparatus 10 includes a transparent substrate 110, a first pixel array 120, and a circuit structure 130. The circuit structure 130 includes multiple signal lines 132 and 134 and is substantially opaque. The transparent substrate 110 has multiple display areas 10*a* and multiple transparent areas 10*b*. In one embodiment, the transparent areas 10*b* may include multiple areas of the transparent substrate 110 that are not occupied by the circuit structure 130, and the display areas 10*a* may be multiple areas of the transparent substrate 110 that are occupied by the circuit structure 130. For example, in one embodiment, in a top view of the transparent display apparatus 10, the circuit structure 130 is substantially a mesh structure, and the mesh structure includes multiple longitudinal portions 130- and multiple transverse portions 130-2 that intersect with each other. The display areas 10*a* may respectively correspond to the intersections of the longitudinal portions 130-1 and the transverse portions 130-2. The multiple transparent areas 10*b* may correspond to multiple mesh cells of the mesh structure, but the disclosure is not limited thereto. In one embodiment, the transparent substrate 110 may be glass, quartz, organic polymer, or other suitable materials, but the disclosure is not limited thereto.

The first pixel array 120 is disposed on the transparent substrate 110. The first pixel array 120 includes multiple first pixels 122 and multiple first openings 124. The first pixels 122 are arranged in an array along a first direction d1 and a second direction d2, in which the first direction d1 and the second direction d2 intersect. For example, in one embodiment, the first direction d1 and the second direction d2 may be perpendicular, but the disclosure is not limited thereto. Each first pixel 122 overlaps with a corresponding display area 10*a* in a third direction d3, in which the third direction d3 is perpendicular to the first direction d1 and the second direction d2. Each first opening 124 is surrounded by a portion of the first pixels 122, and each first opening 124 overlaps with a corresponding transparent area 10*b* in the third direction d3. For example, in one embodiment, each first opening 124 may be a closed opening, but the disclosure is not limited thereto.

In one embodiment, each first pixel 122 may include multiple sub-pixels 122*r*, 122*g*, and 122*b* respectively configured to emit a first color light, a second color light, and a third color light. For example, in one embodiment, the first color light, the second color light, and the third color light may respectively be red light, green light, and blue light, but the disclosure is not limited thereto.

The signal lines 132 and 134 of the circuit structure 130 are disposed on the transparent substrate 110 and are electrically connected to the first pixels 122. The signal lines 132 and 134 may be any conductive lines configured to drive the first pixel 122. Specifically, in one embodiment, the circuit structure 130 also includes multiple pixel driving circuits (not shown). Each first pixel 122 includes a light-emitting element 122*a*, and the light-emitting element 122*a* of each first pixel 122 is electrically connected to a corresponding pixel driving circuit. For example, in one embodiment, the pixel driving circuit may include a first transistor (not shown), a second transistor (not shown), and a capacitor (not shown). The second terminal of the first transistor is electrically connected to the control terminal of the second transistor. The capacitor is electrically connected to the second terminal of the first transistor and the first terminal of the second transistor. The first electrode (not shown) of the light-emitting element 122*a* is electrically connected to the second terminal of the second transistor. The signal lines 132 and 134 may include a data line electrically connected to the first terminal of the first transistor, a scan line electrically connected to the control terminal of the first transistor, and a power line electrically connected to the first terminal of the second transistor. In one embodiment, the light-emitting element 122*a* is, for example, a light-emitting diode element, but the disclosure is not limited thereto.

In one embodiment, the signal lines 132 and 134 may include multiple first signal lines 132 extending substantially along the first direction d1 and multiple second signal lines 134 extending substantially along the second direction d2. The longitudinal portion 130-1 and the transverse portion 130-2 of the circuit structure 130 may respectively include a first signal line 132 and a second signal line 134. The first signal line 132 and the second signal line 134 may be straight conductive lines or curved conductive lines. The first signal line 132 and the second signal line 134 may be formed of the same or different patterned conductive layers. The first signal line 132 and the second signal line 134 may be a signal line of a single-layer structure or a signal line of a multi-layer stacked structure. The material of the first signal line 132 and the second signal line 134 is preferably an opaque conductive material (e.g., metal), but the disclosure is not limited thereto. In one embodiment, one of the first signal line 132 and the second signal line 134 is, for example, a data line, and the other one of the first signal line 132 and the second signal line 134 is, for example, a scan line and/or a power line, but the disclosure is not limited thereto.

In one embodiment, the transparent display apparatus 10 may further include a transparent packaging element 140 (shown in FIG. 1). The transparent packaging element 140 is disposed on the first side S1 of the transparent substrate 110 and covers multiple first pixels 122. The transparent substrate 110, the circuit structure 130, the first pixel array 120, and the transparent packaging element 140 may be regarded as the first display panel DP1. The first display panel DP1 has a first display surface 10*f* and a back surface 10*r*. In one embodiment, the first display surface 10*f* may be a surface of the transparent packaging element 140, and the back surface 10*r* may be a surface of the transparent substrate 110 facing away from the first pixel array 120. In one embodiment, the transparent packaging element 140 may include transparent packaging glue and/or a transparent cover, but the disclosure is not limited thereto.

It is worth noting that the transparent display apparatus 10 further includes a light leakage suppressing element 150. The light leakage suppression element 150 includes multiple light blocking structures 152 spaced apart from each other, in which the transparent substrate 110 has a first side S1 and a second side S2 opposite to each other, and the first pixels 122 are disposed on the first side S1 of the transparent substrate 110. At least a portion of each light blocking structure 152 of the light leakage suppressing element 150 is disposed on the second side S2 of the transparent substrate 110. That is, at least a portion of each light blocking structure 152 of the light leakage suppressing element 150 is disposed on the back surface 10*r* of the first display panel DP1. In one embodiment, the entire light leakage suppression element 150 may be completely disposed on the second side S2 of the transparent substrate 110, but the disclosure is not limited thereto.

In addition, it should be noted that the position of the light leakage suppressing element 150 is not limited to the outermost layer of the second side S2 of the transparent substrate 110. In an embodiment not shown, the light leakage suppression element 150 may also be located in the film layer, and the light leakage suppression element 150 may be located between the external protective backplane (not shown) and the transparent substrate 110 of the first display panel DP1.

The light-emitting element 122*a* of the first pixel 122 emits the light beam L toward the first side S1 of the transparent substrate 110. The first portion 11 of the light beam L passes through the first display surface 10*f* and is transmitted to the outside world. The second portion 12 of the light beam L is reflected on the interface 11 between the first display surface 10*f* and the outside world, and is transmitted to the second side S2 of the transparent substrate 110. At this time, the light leakage suppression element 150 disposed on the second side S2 of the transparent substrate 110 may absorb the second portion 12 of the light beam L, thereby improving the backside light leakage problem of the first display panel DP1. In one embodiment, the absorption spectrum of the light leakage suppression element 150 may include a visible light band and/or an emission band of the light-emitting element 122*a*.

In an embodiment, the light blocking structures 152 of the light leakage suppression element 150 may respectively overlap with the longitudinal portions 130-1 of the circuit structure 130. That is, the light blocking structures 152 of the light leakage suppression element 150 may overlap with the first signal lines 132. In one embodiment, the first pixels 122 are arranged with a first pitch P1 in the first direction d1, the light blocking structures 152 are arranged with a second pitch P2 in the second direction d2, and the first pitch P1 and the second pitch P2 are substantially equal.

In one embodiment, the first pixels 122 are arranged into multiple first pixel columns C122, and the first pixels 122 in each first pixel column C122 are arranged in the first direction d1. Each light blocking structure 152 may respectively overlap with multiple first pixel columns C122. In one embodiment, the light blocking structures 152 may be multiple strip structures respectively overlapping multiple first pixel columns C122.

Referring to FIG. 1, the intensity of the light beam L leaking from the back surface 10*r* of the first display panel DP1 is I(θ), $I(\theta)=I_0\cdot R(\theta)\cdot T(\theta)$, where $I_0$ is the luminous intensity of the light-emitting element 122*a*, R(θ) is the reflectance of the light beam L on the first display surface 10*f* of the first display panel DP1, T(θ) is the transmittance of the light beam L on the back surface 10*r* of the first display panel DP1, θ is the incident angle of the light beam L incident on the first light-emitting surface 10*f*. The incident angle θ of the light beam L incident on the first light-emitting surface 10*f* is substantially equal to the incident angle of the light beam L incident on the back surface 10*r*. When the refractive index of the transparent packaging element 140 and the first transparent substrate 110 are the same (or in other words, the transparent packaging element 140 and the first transparent substrate 110 are the same material, such as glass), then $R(\theta)+T(\theta)\approx 1$. The geometric mean is less than or equal to the arithmetic mean, that is, $$\sqrt{R(\theta)\times T(\theta)} \leq \frac{[R(\theta)+T(\theta)]}{2}.$$

Substituting $R(\theta)=1-T(\theta)$ into $$\sqrt{R(\theta)\times T(\theta)} \leq \frac{[R(\theta)+T(\theta)]}{2},$$

we may derive $R(\theta)\times T(\theta)\leq 0.25$. From $R(\theta)\times T(\theta)\leq 0.25$, we may derive that $I_0\cdot R(\theta)\cdot T(\theta)\leq 0.25I_0$. Substituting $I(\theta)=I_0\cdot R(\theta)\cdot T(\theta)$ into $I_0\cdot R(\theta)\cdot T(\theta)\leq 0.25I_0$, we get: $I(\theta)\leq 0.25\cdot I_0$. From $I(\theta)\leq 0.25\cdot I_0$, we know that the maximum value of I(θ) is $0.25\cdot I_0$, and $I(\theta)=I_0\cdot R(\theta)\cdot T(\theta)=I_0\cdot R(\theta)\cdot[1-R(\theta)]=I_0\cdot[R(\theta)-R^2(\theta)]$. From the maximum value of I(θ) is $0.25I_0$, and $I(\theta)=I_0\cdot[R(\theta)-R^2(\theta)]$, it may be seen that when R(θ)=50%, I(θ) has a maximum value $0.25\cdot I_0$. Thus, the incident angle of R(θ)=50% is $\theta_{max}$. $\theta_{max}$ may be calculated based on the following Formula (2) and the following Formula (3).

$$\left(\frac{n_1\cos\theta_{max}-n_2\cos\theta_t}{n_1\cos\theta_{max}+n_2\cos\theta_t}\right)^2=50\%; \quad \text{Formula (2)}$$

$$n_1\cdot\sin\theta_{max}=n_2\cdot\sin\theta_t; \quad \text{Formula (3)}$$

Where $n_1$ is the refractive index of the transparent substrate 110, $n_2$ is the refractive index of a medium (such as but not limited to: air) adjacent to the second side S2 of the transparent substrate 110, $\theta_t$ is the exit angle for the light beam L leaving the transparent substrate 110 and transmitting towards the second side S2.

Figure 3:
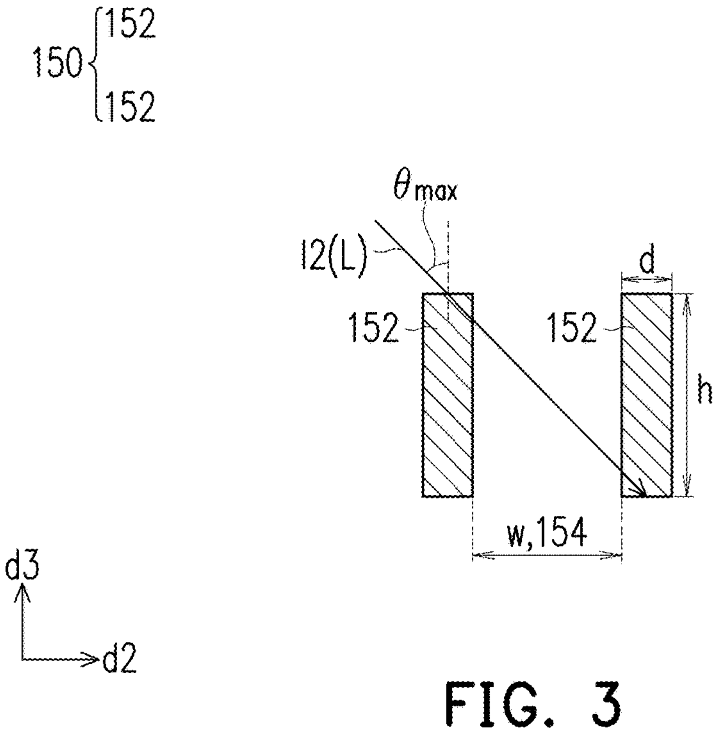
FIG. 3 is a cross-sectional schematic diagram of a portion of a light leakage suppression element according to an embodiment of the disclosure.

FIG. 3 is a cross-sectional schematic diagram of a portion of a light leakage suppression element according to an embodiment of the disclosure. Referring to FIG. 1 and FIG. 3, in one embodiment, if the light leakage suppression element 150 may block the portion with the highest light intensity in the second portion 12 of the light beam L (i.e., the portion of the light beam L incident on the back surface 10*r* from within the transparent substrate 110 at an incident angle $\theta_{max}$), the effect of the light leakage suppression element 150 may be optimized.

Specifically, in one embodiment, two adjacent light blocking structures 152 of the light leakage suppression element 150 have a gap 154 in the second direction d2, the gap 154 has a gap width w in the second direction d2, one of the two adjacent light blocking structures 152 has a light blocking width d in the second direction d2, one of the two adjacent light blocking structures 152 has a light blocking height h in the third direction d3. In one embodiment, when the gap width w, the light blocking width d, and the light blocking height h satisfy the following Formula (1), the light blocking structure 152 may effectively block/absorb the portion with the highest light intensity in the second portion 12 of the light beam L, and the light leakage suppression effect of the light leakage suppression element 150 may be optimized.

$$\tan\theta_{max}=\frac{w+d}{h} \quad \text{Formula (1)}$$

In one embodiment, considering the transparency of the transparent display apparatus 10, it is preferable that the opening ratio A of the light leakage suppression element 150 is greater than or equal to 70%, where $$A = \frac{w}{w+d}.$$

That is, in one embodiment, the gap width w, the light blocking width d, and the light blocking height h of the light leakage suppressing element 150 preferably satisfy:

$$\frac{w}{w+d} \geq 70\%,$$

but the disclosure is not limited thereto.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 4:
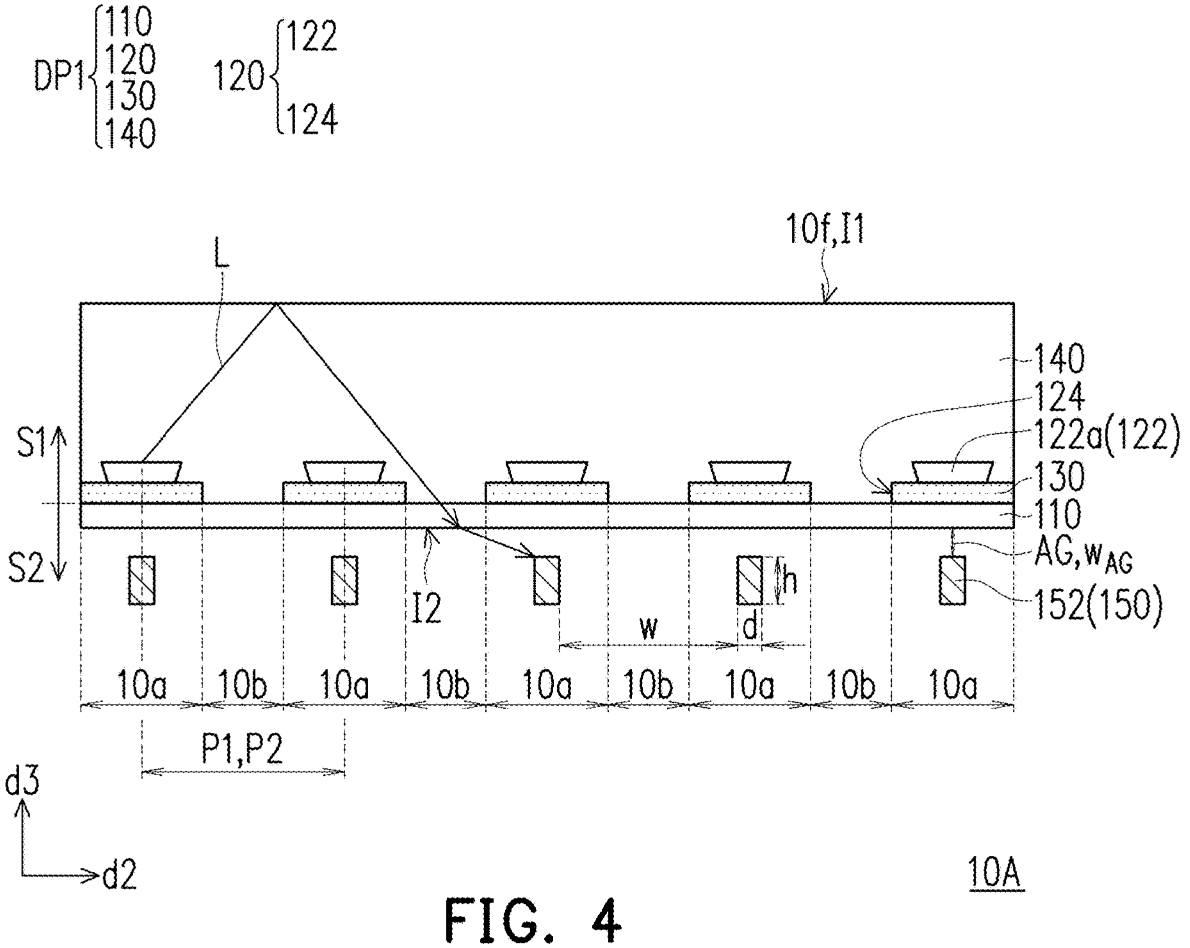
FIG. 4 is a cross-sectional schematic diagram of a transparent display apparatus according to another embodiment of the disclosure.

FIG. 4 is a cross-sectional schematic diagram of a transparent display apparatus according to another embodiment of the disclosure. The transparent display apparatus 10A of the embodiment of FIG. 4 is similar to the transparent display apparatus 10 of the embodiment of FIG. 1 and FIG. 3. The differences between the two are as follows: in the embodiments of FIG. 1 and FIG. 3, in the third direction d3, air gap does not exist between the light blocking structure 152 of the light leakage suppression element 150 and the transparent substrate 110; in the embodiment of FIG. 4, in the third direction d3, an air gap AG exists between the light blocking structure 152 of the light leakage suppression element 150 and the transparent substrate 110. In an embodiment, the air gap AG has a width $W_{AG}$ in the third direction d3, and $$w_{AG} = \frac{w}{\tan\theta_{max}}.$$

In the embodiment of FIG. 4, an air gap AG exists between the light blocking structure 152 and the transparent substrate 110. The light beam L is deflected at a larger angle at the interface 12 between the transparent substrate 110 and the air gap AG, therefore the light blocking height h of the light blocking structure 152 may be lower. In this way, the light leakage suppressing element 150 may be reduced in thickness.

For example, when the resolution of the first display panel DP1 is 85PPI, the refractive index of the transparent substrate 110 is $n_1$=1.5, and the refractive index of the medium adjacent to the second side S2 of the transparent substrate 110 is $n_2$=1.0, as shown in the embodiments of FIG. 1 and FIG. 3, the incident angle of the portion of the light beam L with the highest light intensity is $\theta_{max}$=41°, the light blocking height h of the light blocking structure 152 of the light leakage suppression element 150 may be 345.1 μm, the maximum value of the light blocking width d of the light blocking structure 152 in the second direction d2 may be 90 μm, and the gap width w of the light leakage suppression element 150 may be 210 μm. Under the same situation (i.e., the resolution of the first display panel DP1 is 85PPI, the refractive index of the transparent substrate 110 is $n_1$=1.5, and the refractive index of the medium adjacent to the second side S2 of the transparent substrate 110 is $n_2$=1.0), in the embodiment of FIG. 4, the incident angle of the portion of the light beam L with the highest light intensity is $\theta_{max}$=83°, and the light blocking height h of the light blocking structure 152 of the light leakage suppressing element 150 is reduced to 36.8 μm.

Figure 5:
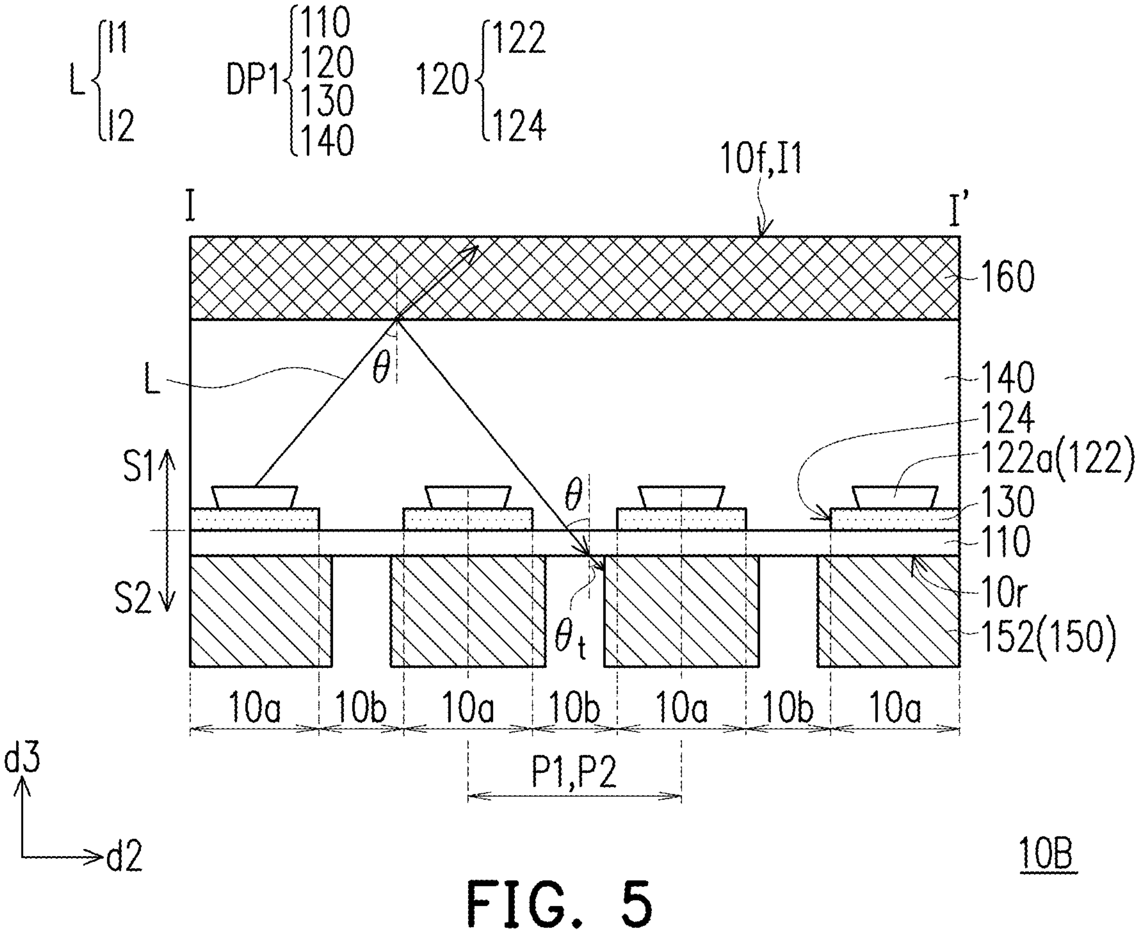
FIG. 5 is a cross-sectional schematic diagram of a transparent display apparatus according to yet another embodiment of the disclosure.

FIG. 5 is a cross-sectional schematic diagram of a transparent display apparatus according to yet another embodiment of the disclosure. The transparent display apparatus 10B of FIG. 5 is similar to the transparent display apparatus 10 of FIG. 1. The difference between the two is that the transparent display apparatus 10B of FIG. 5 further includes a functional film 160. Referring to FIG. 5, the functional film 160 is disposed on the first side S1 of the transparent substrate 110. The first pixels 122 are located between the functional film 160 and the transparent substrate 110. The functional film 160 disposed on the first display surface 10*f* is configured to reduce the reflection of the light beam L on the interface I1 between the first display surface 10*f* and the outside world. For example, in one embodiment, the functional film 160 may be a low refractive index film, an anti-reflective film, a moth-eye film, a refractive index matching film, an absorption film, or a circularly polarizing film.

Figure 6:
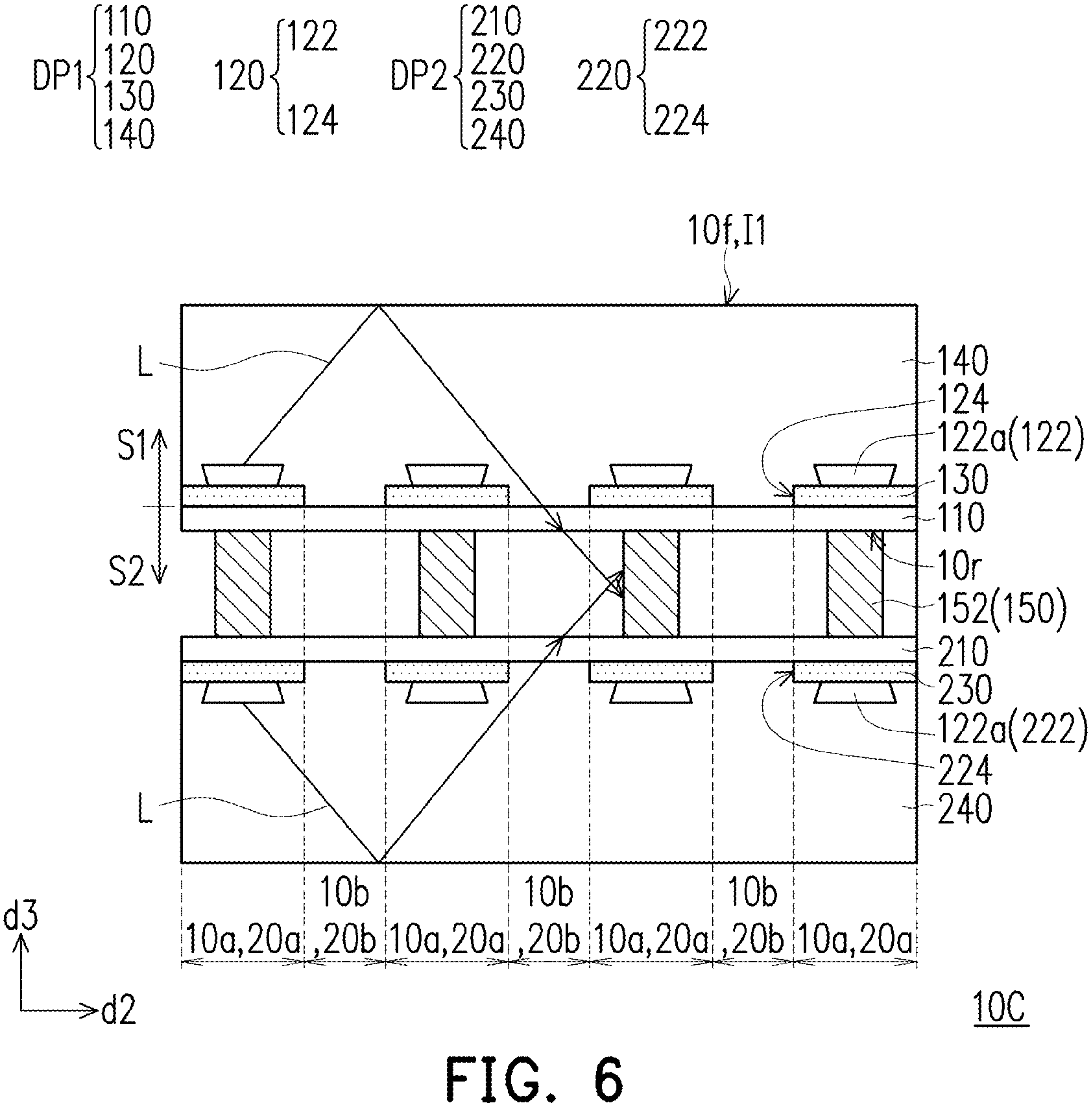
FIG. 6 is a cross-sectional schematic diagram of a transparent display apparatus according to yet another embodiment of the disclosure.

FIG. 6 is a cross-sectional schematic diagram of a transparent display apparatus according to yet another embodiment of the disclosure. The transparent display apparatus 10C of FIG. 6 is similar to the transparent display apparatus 10 of FIG. 1. The difference between the two is that the transparent display apparatus 10C of FIG. 6 further includes a second display panel DP2 disposed on the second side S2 of the transparent substrate 110. The second pixel array 220 of the second display panel DP2 is disposed on the second side S2 of the transparent substrate 110, and the light leakage suppression element 150 is located between the first pixel array 120 of the first display panel DP1 and the second pixel array 220 of the second display panel DP2.

Referring to FIG. 6, specifically, in this embodiment, the second display panel DP2 includes a transparent substrate 210, a circuit structure 230, a second pixel array 220, and a transparent packaging element 240. The transparent substrate 210 of the second display panel DP2 has multiple display areas 20*a* and multiple transparent areas 20*b*. The display areas 20*a* and the transparent areas 20*b* of the transparent substrate 210 of the second display panel DP2 respectively overlap with the display areas 10*a* and the transparent areas 10*b* of the transparent substrate 110 of the first display panel DP1. The second pixel array 220 is disposed on the transparent substrate 210 and includes multiple second pixels 222 and multiple second openings 224. The second pixels 222 and the second openings 224 of the second display panel DP2 respectively overlap with the first pixels 122 and the first openings 124 of the first display panel DP1. The circuit structure 230 is disposed on the transparent substrate 210 and is electrically connected to the second pixels 222. The circuit structure 230 of the second display panel DP2 overlaps with the circuit structure 130 of the first display panel DP1. The transparent packaging element 240 covers the second pixels 222.

In the embodiment of FIG. 6, the transparent display apparatus 10C includes a first display panel DP1 and a second display panel DP2 for respectively displaying toward the first side S1 and the second side S2. The light leakage suppression element 150 disposed between the first display panel DP1 and the second display panel DP2 may be configured to simultaneously suppress backside light leakage of the first display panel DP1 and the second display panel DP2.

Figure 7:
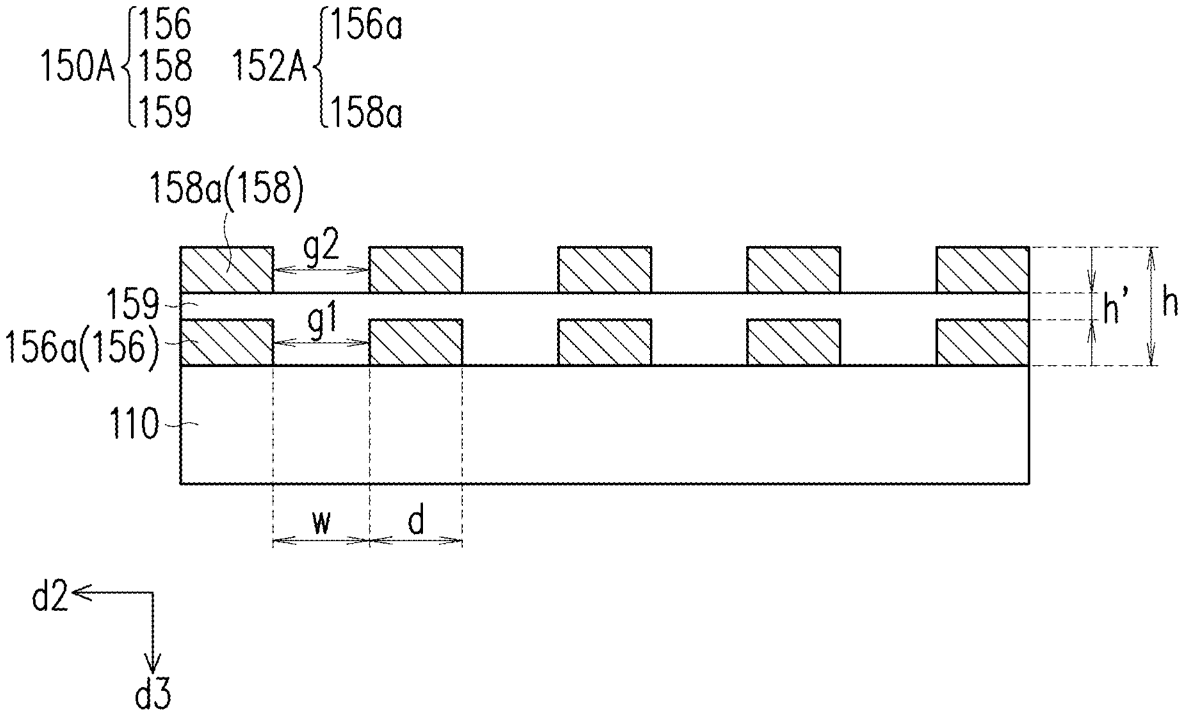
FIG. 7 is a cross-sectional schematic diagram of a light leakage suppression element according to an embodiment of the disclosure.

FIG. 7 is a cross-sectional schematic diagram of a light leakage suppression element according to an embodiment of the disclosure. The light leakage suppression element 150A of FIG. 7 is similar to the light leakage suppression element 150 of FIG. 1. The difference between the two is that the light blocking structure 152A of the light leakage suppression element 150A of FIG. 7 may include multiple film layers.

Specifically, in the embodiment of FIG. 7, the light leakage suppressing element 150A may include a first light blocking pattern layer 156, a second light blocking pattern layer 158, and a transparent spacer layer 159. The first light blocking pattern layer 156 has multiple first light blocking patterns 156*a* spaced apart from each other, and two adjacent first light blocking patterns 156*a* have a first gap g1. The second light blocking pattern layer 158 has multiple second light blocking patterns 158*a* spaced apart from each other, and two adjacent second light blocking patterns 158*a* have a second gap g2. The first light blocking patterns 156*a* respectively overlap with the second light blocking patterns 158*a*. The first gaps g1 respectively overlap with the second gaps g2. The transparent spacer layer 159 is disposed between the first light blocking pattern layer 156 and the second light blocking pattern layer 158, and each light blocking structure 152A may include first light blocking patterns 156*a* and second light blocking patterns 158*a* overlapping each other.

In the embodiment of FIG. 7, the first light blocking pattern 156*a* and the second light blocking pattern 158*a* overlapping each other are separated by a distance h' in the third direction d3, and the distance h' satisfies:

$$\tan\theta_{max} = \frac{d}{h'}.$$

Figure 8:
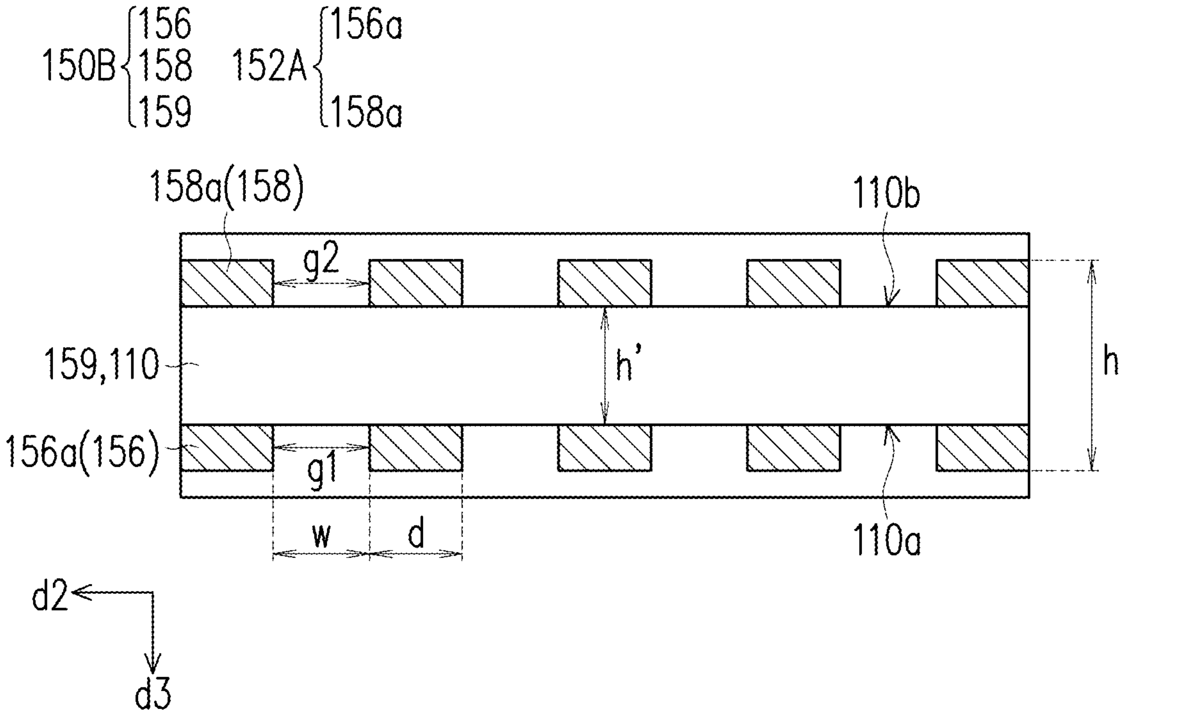
FIG. 8 is a cross-sectional schematic diagram of a light leakage suppression element according to another embodiment of the disclosure.

FIG. 8 is a cross-sectional schematic diagram of a light leakage suppression element according to another embodiment of the disclosure. The light leakage suppression element 150B of FIG. 8 is similar to the light leakage suppression element 150A of FIG. 7, and the differences between them are as follows. In the embodiment of FIG. 7, the transparent spacer layer 159 of the light leakage suppression element 150A may be a transparent element disposed outside the transparent substrate 110. In the embodiment of FIG. 8, the transparent spacer layer 159 of the light leakage suppression element 150B may be the transparent substrate 110, and the first light blocking pattern layer 156 and the second light blocking pattern layer 158 may be respectively disposed on two opposite surfaces 110*a* and 110*b* of the transparent substrate 110.

What is claimed is:

1. A transparent display apparatus, comprising:

a transparent substrate, having a plurality of display areas and a plurality of transparent areas;

a first pixel array, disposed on the transparent substrate, wherein the first pixel array comprises a plurality of first pixels, arranged in an array along a first direction and a second direction, wherein the first direction and the second direction intersect, and each of the plurality of first pixels overlaps a corresponding display area; and a plurality of first openings, wherein each of the plurality of first openings is surrounded by a portion of the plurality of first pixels, and each of the plurality of first openings overlaps with a corresponding transparent area;

a plurality of signal lines, disposed on the transparent substrate and are electrically connected to the plurality of first pixels; and a light leakage suppression element, comprising a plurality of light blocking structures spaced apart from each other, wherein the transparent substrate has a first side and a second side opposite to each other, the plurality of first pixels are disposed on the first side of the transparent substrate, and at least a portion of each of the plurality of light blocking structures of the light leakage suppressing element is disposed on the second side of the transparent substrate.

2. The transparent display apparatus according to claim 1, wherein the plurality of signal lines comprise a plurality of first signal lines extending in the first direction, and the plurality of light blocking structures of the light leakage suppression element overlap with the plurality of first signal lines.

3. The transparent display apparatus according to claim 1, wherein the plurality of first pixels are arranged with a first pitch in the second direction, the plurality of light blocking structures are arranged with a second pitch in the second direction, and the first pitch and the second pitch are substantially equal.

4. The transparent display apparatus according to claim 1, wherein two adjacent light blocking structures have a gap in the second direction, the gap has a gap width w in the second direction, one of the two adjacent light blocking structures has a light blocking width d in the second direction, the one of the two adjacent light blocking structures has a light blocking height h in a third direction, the third direction is perpendicular to the first direction and the second direction, the gap width w, the light blocking width d and the light blocking height h satisfy Formula (1), $$\tan\theta_{max} = \frac{w+d}{h} \text{ – Formula 1,}$$

wherein $\theta_{max}$ satisfies Formula 2 and Formula 3, $$\left(\frac{n_1\cos\theta_{max} - n_2\cos\theta_t}{n_1\cos\theta_{max} + n_2\cos\theta_t}\right)^2 = 50\% \text{ – Formula 2,}$$

$n_1\cdot\sin\theta_{max}=n_2\cdot\sin\theta_t$—Formula 3, wherein $n_1$ is a refractive index of the transparent substrate, $n_2$ is a refractive index of a medium adjacent to the second side of the transparent substrate, and $\theta_t$ is an exit angle for a light beam leaving the transparent substrate and transmitting towards the second side.

5. The transparent display apparatus according to claim 1, wherein two adjacent light blocking structures have a gap in the second direction, the gap has a gap width w in the second direction, one of the two adjacent light blocking structures has a light blocking width d in the second direction, and $$\frac{w}{w+d} \geq 70\%.$$

6. The transparent display apparatus according to claim 1, wherein an air gap exists between the plurality of light blocking structures and the transparent substrate.

7. The transparent display apparatus according to claim 1, further comprising:

a functional film, disposed on the first side of the transparent substrate, wherein the plurality of first pixels are located between the functional film and the transparent substrate, and the functional film comprises a moth-eye film.

8. The transparent display apparatus according to claim 1, further comprising:

a functional film, disposed on the first side of the transparent substrate, wherein the plurality of first pixels are located between the functional film and the transparent substrate, and the functional film comprises a low refractive index film, an anti-reflective film, a refractive index matching film, an absorption film, or a circularly polarizing film.

9. The transparent display apparatus according to claim 1, further comprising:

a second pixel array, disposed on the second side of the transparent substrate, wherein the light leakage suppression element is located between the first pixel array and the second pixel array.

10. The transparent display apparatus according to claim 1, wherein the light leakage suppression element comprises:

a first light blocking pattern layer, having a plurality of first light blocking patterns spaced apart from each other;

a second light blocking pattern layer, having a plurality of second light blocking patterns spaced apart from each other, wherein the plurality of first light blocking patterns respectively overlap with the plurality of second light blocking patterns; and a transparent spacer layer disposed between the first light blocking pattern layer and the second light blocking pattern layer, wherein each of the plurality of light blocking structures comprises one of the plurality of first light blocking patterns and one of the plurality of second light blocking patterns overlapping with each other.

11. A transparent display apparatus, comprising:

a transparent substrate, having a plurality of display areas and a plurality of transparent areas;

a first pixel array, disposed on the transparent substrate, wherein the first pixel array comprises a plurality of first pixels, arranged in an array along a first direction and a second direction, wherein the first direction and the second direction intersect, and each of the plurality of first pixels overlaps a corresponding display area; and a plurality of first openings, wherein each of the plurality of first openings is surrounded by a portion of the plurality of first pixels, and each of the plurality of first openings overlaps with a corresponding transparent area;

a circuit structure, disposed on the transparent substrate and is electrically connected to the plurality of first pixels, wherein the circuit structure comprises longitudinal portions extending the first direction;

a light leakage suppression element, comprising a plurality of light blocking structures spaced apart from each other, wherein the transparent substrate has a first side and a second side opposite to each other, the plurality of first pixels are disposed on the first side of the transparent substrate, at least a portion of each of the plurality of light blocking structures of the light leakage suppressing element is disposed on the second side of the transparent substrate, and the plurality of light blocking structures of the light leakage suppression element overlap with the longitudinal portions.

12. The transparent display apparatus according to claim 11, wherein the plurality of light blocking structures are strip structures extending along the first direction, and the strip structures are arranged along the second direction.

13. The transparent display apparatus according to claim 11, wherein each of the plurality of light blocking structures extending along the first direction overlaps a portion of the plurality of first pixels arranged in the first direction.

* * * * *